(12) United States Patent
Ice (10) Patent No.: US 7,629,537 B2
(45) Date of Patent: Dec. 8, 2009

(54) SINGLE LAYER FLEX CIRCUIT

(75) Inventor: Donald A. Ice, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 147 days.

(21) Appl. No.: 11/179,223

(22) Filed: Jul. 11, 2005

(65) Prior Publication Data

US 2006/0032665 A1    Feb. 16, 2006

Related U.S. Application Data (60) Provisional application No. 60/586,649, filed on Jul. 9, 2004, provisional application No. 60/586,758, filed on Jul. 9, 2004, provisional application No. 60/586,757, filed on Jul. 9, 2004, provisional application No. 60/586,765, filed on Jul. 9, 2004.

(51) Int. Cl.
*H05K 1/00* (2006.01)
(52) U.S. Cl. .................................. 174/254; 361/749
(58) Field of Classification Search ................ 174/254; 361/749–751
See application file for complete search history.

(56) References Cited

U.S. PATENT DOCUMENTS

| | | | |
|---|---|---|---|
| 3,271,214 A | 9/1966 | Tabor | |
| 3,629,787 A | 12/1971 | Wilson | |
| 3,987,676 A | 10/1976 | Bennewitz | |
| 4,011,980 A | 3/1977 | Dvorak et al. | |
| 4,092,061 A | 5/1978 | Stigliani, Jr. | |
| 4,128,697 A | 12/1978 | Simpson | |
| 4,162,817 A | 7/1979 | Briggs et al. | |
| 4,179,802 A | 12/1979 | Joshi et al. | |
| 4,295,696 A | 10/1981 | Gray | |
| 4,375,578 A | 3/1983 | Mitchell et al. | |
| 4,435,031 A | 3/1984 | Black et al. | |
| 4,435,740 A * | 3/1984 | Huckabee et al. | ........... 361/749 |
| 4,769,684 A | 9/1988 | Crocker et al. | |
| 4,815,990 A | 3/1989 | Ristedt et al. | |
| 4,818,099 A | 4/1989 | Preikschat et al. | |
| 4,952,016 A | 8/1990 | Adams et al. | |
| 4,953,006 A | 8/1990 | Kovats et al. | |
| 4,962,991 A | 10/1990 | Carvalho | |
| 4,973,211 A | 11/1990 | Potucek | |
| 5,044,980 A | 9/1991 | Krumme et al. | |
| 5,125,054 A | 6/1992 | Ackley et al. | |
| 5,136,682 A | 8/1992 | Moyer et al. | |
| 5,159,535 A | 10/1992 | Desai et al. | |

(Continued)

FOREIGN PATENT DOCUMENTS

CN    2032364    2/1989

(Continued)

OTHER PUBLICATIONS

U.S. Appl. No. 10/409,837, filed Apr. 9, 2003, Kumar, et al.

(Continued)

*Primary Examiner*—Jeremy C Norris
(74) *Attorney, Agent, or Firm*—Workman Nydegger (57) ABSTRACT

One example of a single-layer flexible circuit may include a top flexible substrate, a bottom flexible substrate, and a conductive layer disposed therebetween. Signal traces and ground traces can be located in the conductive layer.

16 Claims, 8 Drawing Sheets

U.S. PATENT DOCUMENTS

| | | | |
|---|---|---|---|
| 5,212,345 A | 5/1993 | Gutierrez | |
| 5,249,245 A | 9/1993 | Lebby et al. | |
| 5,253,311 A | 10/1993 | Killen et al. | |
| 5,262,590 A * | 11/1993 | Lia | 174/36 |
| 5,299,276 A | 3/1994 | Okamura et al. | |
| 5,343,360 A | 8/1994 | Sanwo | |
| 5,359,686 A | 10/1994 | Galloway et al. | |
| 5,361,317 A | 11/1994 | Hartman et al. | |
| 5,371,820 A | 12/1994 | Welbourn et al. | |
| 5,371,822 A | 12/1994 | Horwitz et al. | |
| 5,375,184 A | 12/1994 | Sullivan | |
| 5,389,686 A | 2/1995 | Diop et al. | |
| 5,409,384 A | 4/1995 | Green et al. | |
| 5,414,786 A | 5/1995 | Ohta et al. | |
| 5,420,954 A | 5/1995 | Swirhun et al. | |
| 5,428,190 A | 6/1995 | Stopperan | |
| 5,432,630 A | 7/1995 | Lebby et al. | |
| 5,452,182 A | 9/1995 | Eichelberger et al. | |
| 5,462,441 A | 10/1995 | Renn et al. | |
| 5,471,552 A | 11/1995 | Wuu et al. | |
| 5,474,463 A | 12/1995 | Robinson et al. | |
| 5,479,288 A | 12/1995 | Ishizuka et al. | |
| 5,495,125 A | 2/1996 | Uemura | |
| 5,499,312 A | 3/1996 | Hahn et al. | |
| 5,539,848 A | 7/1996 | Galloway | |
| 5,545,846 A | 8/1996 | Williams et al. | |
| 5,596,662 A | 1/1997 | Boscher | |
| 5,613,024 A | 3/1997 | Shahid | |
| 5,625,734 A | 4/1997 | Thomas et al. | |
| 5,638,469 A | 6/1997 | Feldman et al. | |
| 5,666,449 A | 9/1997 | Sawae et al. | |
| 5,703,895 A | 12/1997 | Ghirardi et al. | |
| 5,706,378 A | 1/1998 | Suzuki et al. | |
| 5,717,800 A | 2/1998 | Funabashi | |
| 5,733,151 A | 3/1998 | Edsall et al. | |
| 5,752,851 A | 5/1998 | Zaderej et al. | |
| 5,774,614 A | 6/1998 | Gilliland et al. | |
| 5,788,143 A | 8/1998 | Boyd et al. | |
| 5,844,783 A | 12/1998 | Kojima | |
| 5,894,409 A | 4/1999 | Tanaka | |
| 5,974,214 A | 10/1999 | Shacklette et al. | |
| 5,996,222 A | 12/1999 | Shangguan et al. | |
| 6,010,359 A | 1/2000 | Etters et al. | |
| 6,011,695 A | 1/2000 | Dumke | |
| 6,017,222 A | 1/2000 | Kao | |
| 6,039,600 A | 3/2000 | Etters et al. | |
| 6,040,624 A | 3/2000 | Chambers et al. | |
| 6,043,990 A | 3/2000 | Johnson et al. | |
| 6,045,269 A | 4/2000 | Watanabe et al. | |
| 6,069,991 A | 5/2000 | Hibbs-Brenner et al. | |
| 6,088,498 A | 7/2000 | Hibbs-Brenner et al. | |
| 6,091,475 A | 7/2000 | Ogino et al. | |
| 6,118,072 A | 9/2000 | Scott | |
| 6,118,666 A | 9/2000 | Aoki et al. | |
| 6,162,065 A | 12/2000 | Benham | |
| 6,181,011 B1 | 1/2001 | Rostoker et al. | |
| 6,195,261 B1 | 2/2001 | Babutzka et al. | |
| 6,268,231 B1 | 7/2001 | Wetzel | |
| 6,294,255 B1 | 9/2001 | Suzuki et al. | |
| 6,300,164 B1 | 10/2001 | Call et al. | |
| 6,305,848 B1 | 10/2001 | Gregory | |
| 6,326,553 B1 | 12/2001 | Yim et al. | |
| 6,350,063 B1 | 2/2002 | Gilliland et al. | |
| 6,380,493 B1 | 4/2002 | Morita et al. | |
| 6,404,960 B1 | 6/2002 | Hibbs-Brenner et al. | |
| 6,439,918 B1 | 8/2002 | Togami et al. | |
| 6,473,314 B1 | 10/2002 | Custer et al. | |
| 6,483,712 B1 | 11/2002 | Oliphant et al. | |
| 6,485,322 B1 | 11/2002 | Branch et al. | |
| 6,521,989 B2 | 2/2003 | Zhou | |
| 6,537,082 B2 | 3/2003 | Hopfer, III et al. | |
| 6,580,739 B1 | 6/2003 | Coldren | |
| 6,586,678 B1 | 7/2003 | Rosenberg et al. | |
| 6,617,518 B2 | 9/2003 | Ames et al. | |
| 6,624,000 B1 | 9/2003 | Coldren | |
| 6,700,079 B2 | 3/2004 | Bogursky et al. | |
| 6,703,561 B1 | 3/2004 | Rosenberg et al. | |
| 6,709,607 B2 | 3/2004 | Hibbs-Brenner et al. | |
| 6,734,658 B1 | 5/2004 | Bierer | |
| 6,767,220 B2 | 7/2004 | Wilson et al. | |
| 6,769,920 B1 | 8/2004 | Mease et al. | |
| 6,781,727 B2 | 8/2004 | Auracher et al. | |
| 6,800,169 B2 | 10/2004 | Liu et al. | |
| 6,809,905 B2 | 10/2004 | Kilmer | |
| 6,812,803 B2 | 11/2004 | Goergen | |
| 6,841,733 B2 | 1/2005 | Schiaffino et al. | |
| 6,852,928 B2 | 2/2005 | Giaretta et al. | |
| 6,860,649 B2 | 3/2005 | Edwards et al. | |
| 6,863,453 B2 | 3/2005 | Wang et al. | |
| 6,867,368 B2 | 3/2005 | Kumar | |
| 6,867,377 B2 | 3/2005 | Anderson et al. | |
| 6,878,875 B2 | 4/2005 | Aronson et al. | |
| 6,911,599 B2 | 6/2005 | Rosenberg et al. | |
| 6,947,672 B2 | 9/2005 | Jiang et al. | |
| 6,996,304 B2 | 2/2006 | Aronson et al. | |
| 7,010,233 B2 | 3/2006 | Lindblad | |
| 7,066,659 B2 | 6/2006 | Aronson et al. | |
| 7,275,937 B2 | 10/2007 | Ellison | |
| 7,311,240 B2 | 12/2007 | Nippa et al. | |
| 2001/0017376 A1 | 8/2001 | Verdiell | |
| 2002/0136501 A1 | 9/2002 | Yen et al. | |
| 2002/0170742 A1 | 11/2002 | Liaw et al. | |
| 2002/0181895 A1 | 12/2002 | Gilliland et al. | |
| 2003/0102157 A1 | 6/2003 | Rosenberg et al. | |
| 2003/0197254 A1 | 10/2003 | Huang | |
| 2004/0018409 A1 | 1/2004 | Hui et al. | |
| 2004/0062491 A1 | 4/2004 | Sato et al. | |
| 2004/0090620 A1 | 5/2004 | Farr | |
| 2004/0092135 A1 | 5/2004 | Hofmeister et al. | |
| 2004/0151505 A1 | 8/2004 | Aronson et al. | |
| 2004/0202214 A1 | 10/2004 | Aronson et al. | |
| 2005/0018409 A1 | 1/2005 | Hirakata | |
| 2005/0045374 A1 | 3/2005 | Kumar | |
| 2005/0130488 A1 | 6/2005 | Zhu et al. | |
| 2005/0242160 A1 | 11/2005 | Nippa et al. | |
| 2005/0244095 A1 | 11/2005 | Ellison | |
| 2005/0245103 A1 | 11/2005 | Ellison | |
| 2005/0245118 A1 | 11/2005 | Liu et al. | |
| 2005/0265650 A1 | 12/2005 | Priyadarshi et al. | |
| 2006/0062526 A1 | 3/2006 | Ikeuchi | |

FOREIGN PATENT DOCUMENTS

| | | |
|---|---|---|
| CN | 03808386.8 | 9/2007 |
| GB | 0 881 671 | 12/1998 |
| GB | 0 905 838 | 3/1999 |
| JP | 61-071689 | 4/1986 |
| JP | 62-114545 | 5/1987 |
| JP | 63-136680 | 6/1988 |
| JP | 01-169986 | 5/1989 |
| JP | 02-240989 | 9/1990 |
| JP | 03-148190 | 6/1991 |
| JP | 406034838 | 2/1994 |
| JP | 407159636 | 6/1995 |
| JP | 09-223848 | 8/1997 |
| JP | 2000228006 | 8/2000 |
| JP | 2003568752 | 5/2007 |
| WO | 92/00538 | 1/1992 |

OTHER PUBLICATIONS

U.S. Appl. No. 10/835,832, filed Apr. 30, 2004, Kumar, et al.
U.S. Appl. No. 10/836,728, filed Apr. 30, 2004, Ellison.
U.S. Appl. No. 11/094,990, filed Mar. 31, 2005, Liu, et al.
U.S. Appl. No. 10/687,107, filed Oct. 16, 2003, Aronson, et al.

U.S. Appl. No. 10/836,129, filed Apr. 30, 2004, Nippa, et al.
Murata, S., Nishimura, K., *Improvement in Thermal Properties of a Multi-Beam Laser Diode Array*, Japanese Journal of Applied Physics, vol. 28, Suppl. 28-3, pp. 165-170 (1989).
Ali, "New Materials and Design Components for Integrated Optics," Technology Report/Fiberoptics, Laser Focus World, vol. 21, No. 8, Aug. 1985, Tulsa, U.S., pp. 48-50.
Cohen, "Passive Laser-Fiber Alignment by Index Method," IEEE Photonics Technology Letters, vol. 3, No. 11, Dec. 1991, pp. 985-987, New York, U.S.
Coldren, et al., "Flip-Chip Bonded, Back-Emitting, Microlensed Arrays of Monolithic Vertical Cavity Lasers and Resonant Photodetectors," Electronic Components and Technology Conference, Sep. 1999, pp. 733-740.
Havant, "Flexible Interposing Carrier Scheme for Optical Waveguides," Research Disclosure No. 303, Jul. 1989, p. 512.
Hibbs-Brenner, et al., "Packaging of VCSEL Arrays for Cost-Effective Interconnects at <10 Meters," Electronic Components and Technology Conference, Sep. 1999, pp. 747-752.
Hsu, et al., "Flip-chip Approach to Endfire Coupling Between Single-Mode Optical Fibres and Channel Waveguides," Patent Associates Literature, Electronic Letters, vol. 12, No. 16, pp. 404-405, Aug. 5, 1976.
Kazlas, et al., "Monolithic Vertical-Cavity Laser/p-i-n Photodiode Transceiver Array for Optical Interconnects," IEEE Photonics Technology Letters, Nov. 1998, pp. 1530-1532, vol. 10, No. 11.
Louderback, et al., "Flip Chip Bonded Arrays of Monolithically Integrated, Microlensed Vertical-Cavity Lasers and Resonant Photodetectors," IEEE Photonics Technology Letters, Mar. 1999, pp. 304-306, vol. II, No. 3.
Plawsky, et al., "Photochemically Machined, Glass Ceramic, Optical Fiber, Interconnection Components," Article, Optoelectronic Materials, Devices, Packaging and Interconnects (1998), SPIE, vol. 994, pp. 101-106.
Sullivan, et al., "Polymeric Waveguides," 1992 IEEE, pp. 27-31.
U.S. Appl. No. 10/077,067, filed Feb. 14, 2002, Rosenberg.
U.S. Appl. No. 10/231,395, filed Aug. 29, 2002, Rosenberg.
U.S. Appl. No. 10/629,253, filed Jul. 28, 2003, Aronson.
U.S. Appl. No. 10/629,724, filed Jul. 28, 2003, Giaretta.
U.S. Appl. No. 10/748,051, filed Dec. 30, 2003, Aronson.
U.S. Appl. No. 10/795,597, filed Mar. 8, 2004, Rosenberg.
U.S. Appl. No. 11/029,067, filed Jan. 3, 2005, Aronson.
U.S. Appl. No. 10/629,253, filed Feb. 24, 2005, Office Action.
U.S. Appl. No. 10/629,253, filed Oct. 4, 2005, Office Action.
U.S. Appl. No. 10/629,724, filed Sep. 22, 2004, Notice of Allowance.
U.S. Appl. No. 10/409,837, filed Jun. 15, 2005, Office Action.
U.S. Appl. No. 10/409,837, filed Oct. 31, 2005, Office Action.
U.S. Appl. No. 10/409,837, filed May 26, 2006, Office Action.
U.S. Appl. No. 10/409,837, filed Nov. 14, 2006, Office Action.
U.S. Appl. No. 10/409,837, filed May 17, 2007, Office Action.
U.S. Appl. No. 10/409,837, filed Dec. 7, 2007, Office Action.
U.S. Appl. No. 10/687,107, filed Oct. 6, 2006, Office Action.
U.S. Appl. No. 10/687,107, filed Apr. 10, 2007, Office Action.
U.S. Appl. No. 10/687,107, filed Oct. 17, 2007, Office Action.
U.S. Appl. No. 10/835,832, filed Oct. 19, 2005, Office Action.
U.S. Appl. No. 10/835,832, filed Jun. 7, 2006, Office Action.
U.S. Appl. No. 10/835,832, filed Dec. 15, 2006, Office Action.
U.S. Appl. No. 10/835,832, filed Aug. 9, 2007, Office Action.
U.S. Appl. No. 10/835,832, filed Dec. 28, 2007, Office Action.
U.S. Appl. No. 10/836,129, filed Mar. 13, 2006, Office Action.
U.S. Appl. No. 10/836,129, filed Aug. 10, 2007, Notice of Allowance.
U.S. Appl. No. 10/836,728, filed Jul. 19, 2005, Office Action.
U.S. Appl. No. 10/836,728, filed Jan. 18, 2006, Office Action.
U.S. Appl. No. 10/836,728, filed May 5, 2006, Office Action.
U.S. Appl. No. 10/836,728, filed Jan. 16, 2007, Office Action.
U.S. Appl. No. 10/836,728, filed May 30, 2007, Notice of Allowance.
U.S. Appl. No. 10/836,728, filed Jul. 25, 2007, Notice of Allowance.
U.S. Appl. No. 10/748,051, filed May 27, 2004, Office Action.
U.S. Appl. No. 10/795,597, filed Aug. 25, 2004, Notice of Allowance.
U.S. Appl. No. 10/795,597, filed Jan. 26, 2005, Notice of Allowance.
U.S. Appl. No. 11/029,067, filed Jun. 29, 2005, Notice of Allowance.
U.S. Appl. No. 11/094,990, filed Mar. 28, 2006, Office Action.
U.S. Appl. No. 11/094,990, filed Oct. 12, 2006, Office Action.
U.S. Appl. No. 11/094,990, filed Apr. 5, 2007, Office Action.
U.S. Appl. No. 11/094,990, filed Dec. 6, 2007, Office Action.
U.S. Appl. No. 11/094,990, filed May 6, 2008, Notice of Allowance.

\* cited by examiner

SINGLE LAYER FLEX CIRCUIT

CROSS-REFERENCE TO RELATED APPLICATIONS

This application claims the benefit of the following U.S. Provisional Patent Applications: Ser. No. 60/586,649, filed Jul. 9, 2004, and entitled "Single Layer Flexible Circuits;" Ser. No. 60/586,758, filed Jul. 9, 2004 and entitled "Methods and Devices for Attaching Single Layer Flexible Circuits to Circuit Boards;" Ser. No. 60/586,757, filed Jul. 9, 2004 and entitled "Circuit Board for Use With Single Layer Flexible Circuit;" and Ser. No. 60/586,765, filed Jul. 9, 2004 and entitled "Methods and Devices for Attaching Flexible Circuits to Circuit Boards." Each of the above applications is incorporated herein by reference in its entirety.

BACKGROUND OF THE INVENTION

1. The Field of the Invention

The present invention relates generally to high speed data transmission systems. More particularly, the present invention relates to a single layer flexible circuit.

2. The Related Technology

Fiber-optics and optoelectronics are important aspects of modern networking circuits because they allow for efficient, accurate and rapid transmission of data between various components in the network system. As with the design of most systems, design considerations often determine the extent of use of a fiber optic system. For example, the size and modularity of components or devices must often be balanced against the need for additional space to accommodate heat dissipation and circuit monitoring components. While it is desirable to minimize the size of the component, some design considerations have previously limited this minimization due to their inherent characteristics. For example, some optoelectronic components generate large amounts of heat which become more difficult to dissipate as the size of the component becomes smaller. Further, as the component becomes smaller, there is less space available for mounting and connecting additional components thereto.

Modular components are desirable in fiber optic systems to reduce the cost of manufacturing the system, which cost increases the more customized the system becomes. An example of a modular component is a transceiver. Transceivers usually include an input receiver optical subassembly (ROSA) and an output transmitter optical subassembly (TOSA). The ROSA comprises a photodiode for detecting optical signals and sensing circuitry for converting the optical signals to digital signals compatible with other network components. The TOSA comprises a laser for transmitting optical signals and control circuitry for modulating the laser according to an input digital data signal. The TOSA has an optical lens for collimating the light signals from the laser of the TOSA to an optical fiber. Additionally, the transceiver includes pluggable receptacles for optically connecting the TOSA and the ROSA with other components within a fiber optic network. The transceiver often includes an electronic connector for connection to electrical components of a host system that has a computer or communication device with which the transceiver operates.

The design of the transceiver, as well as that of other modular components within the fiber optic system, is preferably standards-based, such that components can be connected without significant customization. Typically, standards define various characteristics such as size, power consumption, and connector configuration. When designing components to operate within a particular standard, attention must be given to what components are selected and how they are configured so as to not exceed the rated power consumption. These components are constrained by principles of semiconductor physics to work preferentially in a certain temperature range. Factors such as power dissipation, size and materials uniquely determine the operating temperature of the component for given ambient conditions, such as ambient temperature, and airflow. The resulting operating temperature determines the types of optical and electronic devices that can be successfully operated within the component.

The photodiode in the ROSA and the laser in the TOSA are examples of optoelectronic components. Generally, these optoelectronic components are sensitive electrical devices which require protection. As such, these optoelectronic components are usually manufactured in packaging assemblies. One such packaging assembly is known as a transistor-outline header or transistor-outline package, referred to herein as a TO package or TO can. TO packages are widely used in the field of optoelectronics, and may be employed in a variety of applications. As such, TO packages are often standardized to facilitate their incorporation into components such as transceivers. The TO packages protect the sensitive electrical devices contained therein and electrically connect such devices to external components such as printed circuit boards ("PCB").

With respect to their construction, the TO packages often include a cylindrical metallic base with a number of conductive leads extending completely through, and generally perpendicular to, the base. The size of the base is often sized to fit within a specific TO standard size and lead configuration, examples of which include a TO-5 or TO-46. The leads are usually hermetically sealed in the base to provide mechanical and environmental protection for the components contained in the TO package, and to electrically isolate the conductive leads from the metallic material of the base. Typically, one of the conductive leads is a ground lead that may be electrically connected directly to the base.

Various types of electrical devices are mounted on one side of the base and connected to the leads. Generally, a cap is used to enclose the side of the base where such electrical devices are mounted, so as to form a chamber that helps prevent contamination or damage to those electrical device(s). The design of the TO package depends on the optoelectronic component being mounted on the base and the modular component to which the TO package will be used. By way of example, in applications where the optoelectronic component mounted on the base is an optical component, the cap is at least partially transparent so to allow an optical signal generated or received by the optical component to be transmitted to or from the TO package. These optical TO packages are also known as window cans.

Problems may arise when connecting the TO package to other components of the circuitry. TO packages have conventionally been connected to a PCB using through-hole technology. That is, vias or holes are drilled through the PCB corresponding to each lead. The base of the TO package is placed parallel to the PCB and the leads are then disposed through the vias and welded, soldered or otherwise connected to the PCB.

However, the conductive lead configuration of a conventional TO package complicates how the package, and ultimately, the modular component to which it is associated, is connected to other components of the system, such as, for example, the PCB. Where it is desirable to position the TO package in any other orientation, the TO packages do not connect as easily to the PCB. The TO package can be positioned on its side such that the base is perpendicular to the PCB. This configuration may be desirable where the optic window is disposed at the top of the package and the incoming or outgoing optical signal is coming from the side (such as in a side-emitting configuration). In this arrangement, the leads of the TO package straddle the outer edge of the PCB such that some of the leads are on the top surface of the PCB and some of the leads are on the bottom surface of the PCB. The leads are then bonded to the PCB and the ends of the leads may be further reinforced using a solder paste. The cap portion of the TO package may be at least partially disposed in a TOSA/ROSA port to form a TOSA/ROSA subassembly which is connected to the housing or chassis of the electronic unit.

In this configuration, the separation or pitch of the leads exiting the TO package and the thickness of the PCB can vary. To form a strong solder joint, the leads should rest on the solder pads of the PCB. Frequently, because of this mis-match between the lead pitch and the thickness of the PCB, the leads must be bent into a flattened "s" shape so they will lie parallel and against the pads of the PCB. This requires either very specialized tooling or manual lead forming by operators. If done manually, the lead forming is frequently imperfect and irregular and the resulting solder joint can be of poor quality. The glass-to-metal seal on the TO package is also subject to cracking and damage from lead forming operations. In addition, the special lead forming operation of this configuration adds extra assembly cost.

This configuration can further be undesirable because the leads are unsupported between the base and the PCB and thus unable to withstand torque, gravitational, or other pressure or jostling which may be applied to the leads during normal use of the electronic unit. For example, the solder pads on the PCB to which the leads are connected are not anchored to the PCB by anything more than just the adhesion of the pad. Thus, the solder pads can become dislodged from the PCB. Further, while solder joints may be applied between the leads and the PCB, the solder joint is not strong, and it could potentially crack or fail. In addition, the other end of the PCB is configured to connect to an edge connector member. When the TO package is connected to the PCB using straddle mounting, the whole structure is rigid so that any stress applied to any part of the structure transfers stress to the solder joint. The foregoing configuration thus presents a module in which failure is likely.

In light of the above discussion, a need exists for a scheme by which leads of an optoelectronic component can be connected to another component, such as a printed circuit board, while avoiding the problems and challenges described above.

BRIEF SUMMARY OF THE INVENTION

The present invention is related to optical devices having an optical subassembly connected to an external component (e.g., a printed circuit board) via a flexible circuit. In one aspect of the invention, a single-layer flexible circuit is used, having a top flexible substrate, a bottom flexible substrate, and a conductive layer disposed between the top flexible substrate and the bottom flexible substrate. In one embodiment, the conductive layer comprises at least one ground trace and at least one signal trace, which can be electrically connected. In one embodiment, at least a portion of the conductive layer has a neutral axis of bending. The single-layer flexible circuit can further include at least one via formed through the conductive layer and the bottom flexible substrate; and at least one bonding pad formed on the bottom flexible substrate, wherein the conductive layer is placed in electrical communication with the at least one bonding pad through the at least one via. The at least one via can be metallized to place the conductive layer in electrical communication with the at least one bonding pad. The invention also includes methods for manufacturing the single-layer flexible circuits.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE EXEMPLARY EMBODIMENTS OF THE INVENTION

I. Optical Devices (e.g., Transceiver Module)

The present invention is directed to methods and structure for manufacturing optical devices using flexible circuit technology. The optical devices generally include one or more optoelectronic packages, one or more printed circuit boards (PCB) or other external component, and a flexible circuit connecting the optoelectronic package to the PCB.

Figure 1:
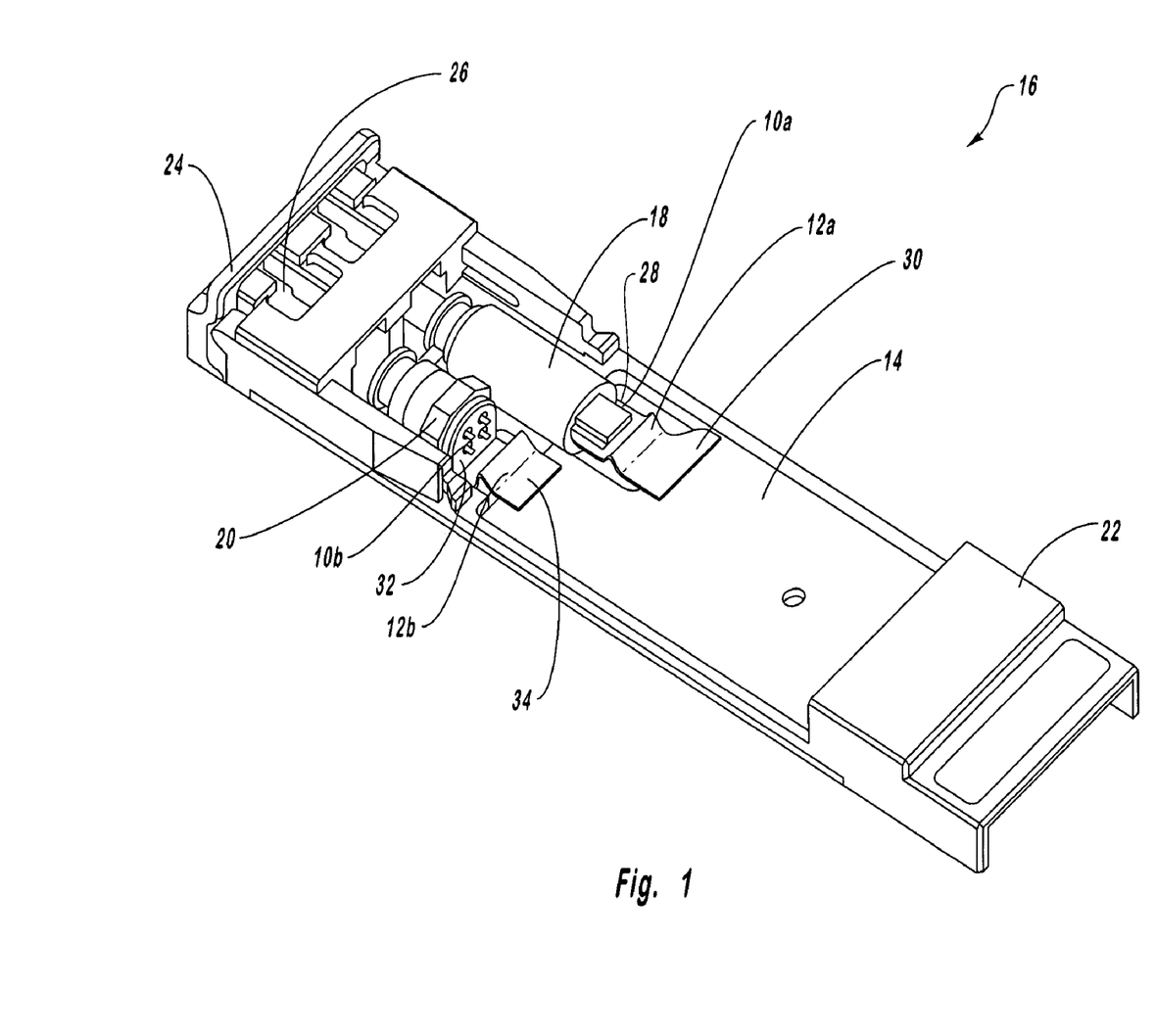
FIG. 1 shows a perspective view of a transceiver assembly according to one embodiment of the invention, illustrating a TOSA and ROSA connected to a printed circuit board via flexible circuits.

As depicted in FIG. 1, a transceiver module 16 includes a transmitter optical subassembly (TOSA) 18, a receiver optical subassembly (ROSA) 20, PCB 14, first flexible circuit 12a and second flexible circuit 12b. First flexible circuit 12a interconnects TOSA 18 and PCB 14 while second flexible circuit 12b interconnects ROSA 20 and PCB 14. Also depicted as part of module 16 are housing 22 for containing the electrical components of module 16 and bail release 24, and LC cable receptacles 26 for receiving and securely connecting LC cables to TOSA 18 and ROSA 20.

The transceiver modules constructed according to the invention can be compatible with the XFP MSA standards, for example including those set forth in the 10 Gigabit Small Form Factor Pluggable Module adoption draft specification Revision 2.0 published by the XFP Multi Source Agreement (MSA) Group on Dec. 16, 2002 (xfpmsa.org), which is incorporated herein by reference, and can also be compatible with future revisions or final XFP MSA specifications that will be adopted in the future. It will be appreciated, however, that the optoelectronic packages 10a, 10b, flexible circuits 12a, 12b and/or PCB 14 need not comply with standardized form factor requirements and may have any size or configuration necessary according to a particular design.

In one embodiment, the depicted module 16 is an XFP transceiver module, which is a 10-Gigabit XFP Form-Factor Pluggable Module for use in telecommunications networks, local area networks, metro area networks, storage area networks, wide area networks, and the like. XFP transceivers are designed to occupy one-fifth of the space and dissipate one-half the power of prior 10 Gb/s modules. In addition, the depicted module may include a temperature-compensated externally modulated laser (EML) for use in dense wavelength division multiplexing applications (DWDM) and therefore be more completely described as a DWDM EML XFP transceiver module.

Referring briefly to FIG. 1, optoelectronic packages 10a, 10b are shown configured to be electrically connected to an external component. As used herein, the term "external component" refers to any component outside the structure of optoelectronic packages 10a, 10b. Flexible circuits 12a, 12b and PCB 14 are examples of external components. Optoelectronic packages 10a, 10b house an optoelectronic component, which optoelectronic component is configured to be electrically connected to flexible circuits 12a, 12b, which, in turn, can be electrically connected to a PCB 14. In addition, optoelectronic packages 10a, 10b, flexible circuits 12a, 12b and PCB 14 can be mechanically connected together.

As used herein, the term "electrically connected" or "electrically connectable" refers to the configuration where the optoelectronic component within the optoelectronic packages 10a, 10b is placed in electrical communication with an external component, such as, but not limited to, flexible circuits 12a, 12b and/or PCB 14. The structures used to electrically connect optoelectronic packages 10a, 10b, and hence the optoelectronic component contained therein, to an external component may or may not be the same structures which mechanically connect optoelectronic packages 10a, 10b to the external component.

TOSA 18 may comprise an EML TOSA. Of course, one skilled in the art will recognize that other TOSA assemblies, for example including such features as a ceramic header TOSA, a distributed feedback laser, a VCSEL, an uncooled EML, a cooled EML, an EML with a wavelocker, and the like, are also compatible with embodiments of the present invention. In the depicted embodiment, TOSA 18 is depicted as connected to first flexible circuit 12a via a header assembly 10a, which will be described in more detail below.

ROSA 20 may comprise, for example, an avalanche photodiode (APD). An APD is a conventional device that operates with a reverse-bias voltage that causes the primary photocurrent to undergo amplification by cumulative multiplication of charge carriers. In the depicted embodiment, ROSA 20 is depicted as connected to second flexible circuit 12b via a conventional optoelectronic package 10b, which will be described in more detail below.

As shown in FIG. 1, first flexible circuit 12a connects to TOSA 18 at a first interface 28 and connects to PCB 14 at a second interface 30. Second flexible circuit 12b connects to ROSA 20 at a first interface 32 and connects to PCB 14 at a second interface 34.

More particularly, flexible circuits 12a, 12b conduct electrical, electrostatic, and electromagnetic signals from optoelectronic packages 10a, 10b in an optical subassembly such as a TOSA or ROSA, to a second electronic device, such as a PCB 14. The connections between the flexible circuits 12a, 12b and adjacent electronic devices preferably include high current, low speed data, and signal connections.

Note that although the depicted flexible circuits connect to one or more of a TOSA, a ROSA, and a PCB, flexible circuits according to the invention are not limited solely to these exemplary embodiments. Rather, the connection devices and methods disclosed herein may be compatibly incorporated into any design wherein a flexible circuit connects to an adjacent electronic device.

The transceiver 16 is one example of an "optical device" that includes one or more optical subassemblies, one or more flexible circuits and one or more printed circuit boards. Other exemplary optical devices include receivers, transmitters, and the like.

II. TOSA and ROSA

Figure 2:
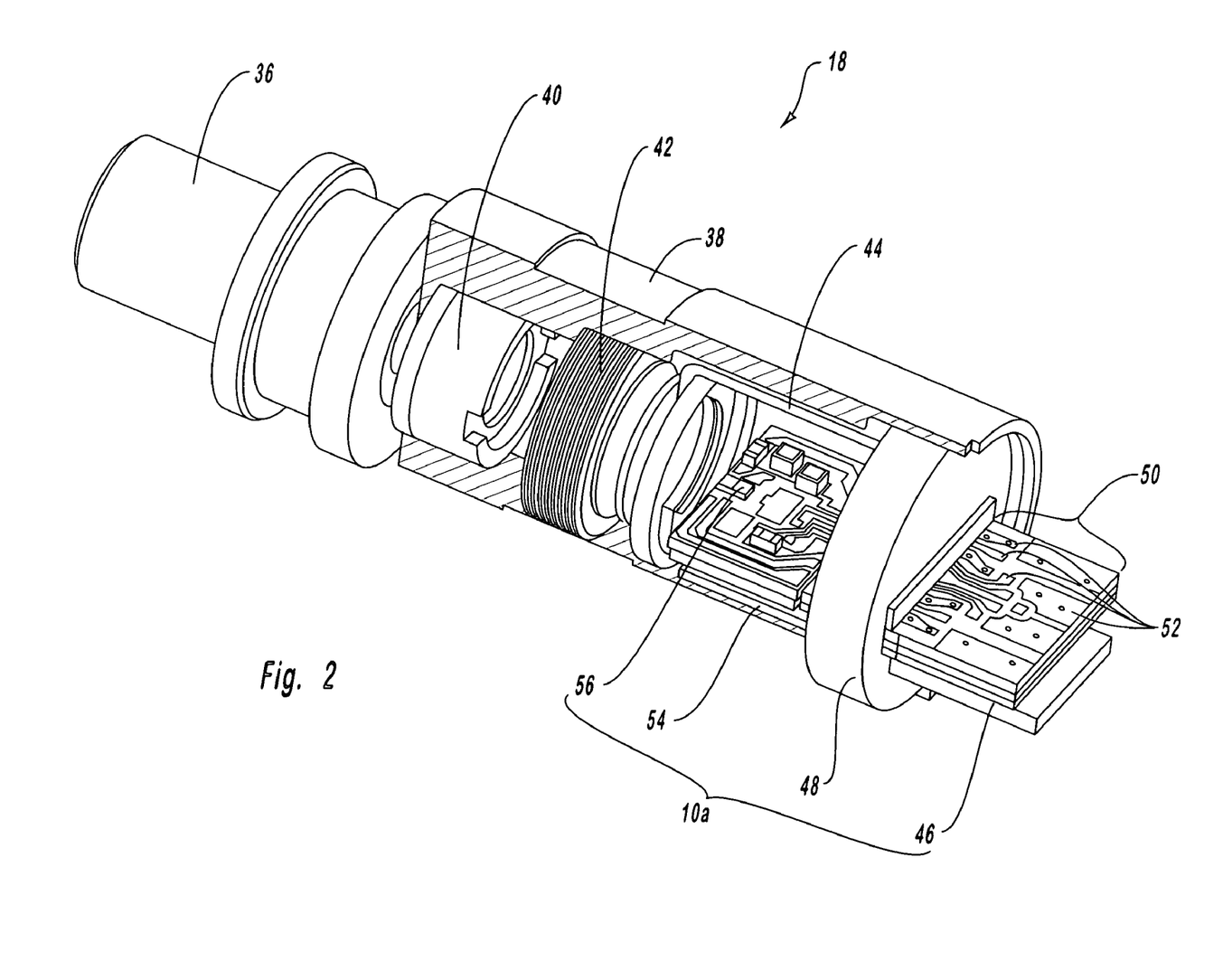
FIG. 2 shows a perspective cutaway view of the TOSA illustrated in FIG. 1.
Figure 3:
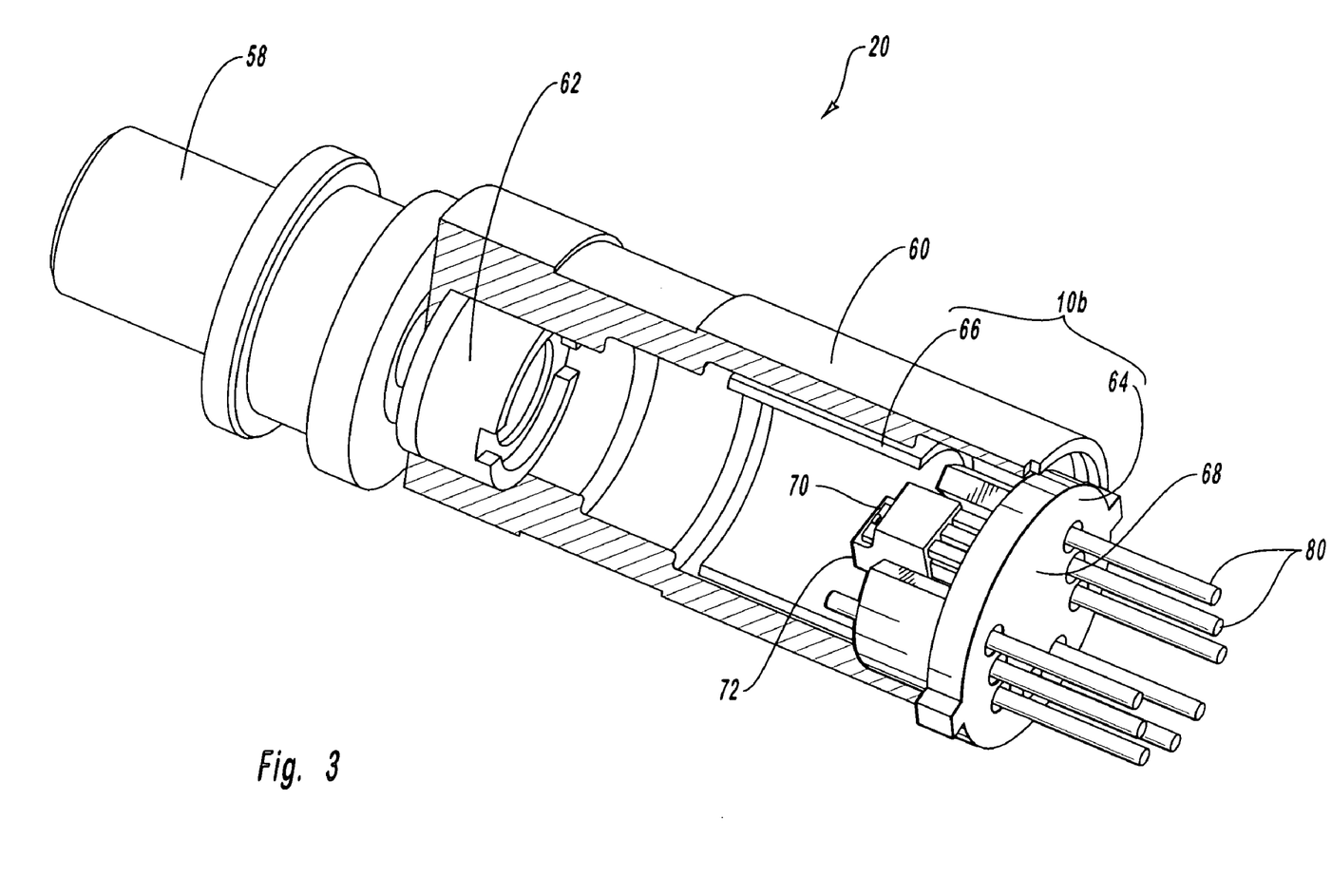
FIG. 3 shows a perspective cutaway view of the ROSA illustrated in FIG. 1.

Turning now to FIGS. 2 and 3, TOSA 18 and ROSA 20 are illustrated in further detail. As shown in FIG. 2, TOSA 18 includes a nosepiece 36 for receiving an LC ferrule connected to a housing 38. The housing 38 at least partially contains an isolator 40, lens assembly 42, and optoelectronic package 10a. Optoelectronic package 10a is a particular embodiment of the invention that includes hermetically sealed window cap 44, thermal slug 46, base 48, and ceramic feed through 50.

Cap 44 includes a window (not shown). The window can be constructed of glass, borosilicate glass with anti-reflective coating, plastic, or any optically transparent material which is hermetically soldered or bonded to the cap 44. The window may have any shape required for design considerations including, but not limited to, circular, square, rectangular, or other polygonal shape.

In one embodiment, the cap 44 includes a body preferably made of Alloy 42 (a nickel/iron alloy), Kovar®, cold-rolled steel, or Vacon VCF-25 Alloy, or other suitable material which provides the hermeticity desired in optoelectronic package 10a and provides sufficient bonding between cap 44, base 48, and/or other support structures. In one embodiment, cap 44 is plated with electrolysis nickel.

As depicted, optoelectronic package 10a comprises a cylindrical metallic base 48 with a ceramic feed through 50 having a number of conductive traces 52 thereon extending completely through, and generally perpendicular to, the base. The base can be formed from similar materials as cap 44. A hermetic seal between thermal slug 46 and base 48 provides mechanical and environmental protection for the components contained in the TO can and electrically isolates the conductive traces from the metallic material of the base.

The ceramic feed through 50 further includes multiple electrically isolated conductive traces 52, or feed throughs, extending throughout ceramic feed through 50 and consequently through base 48. The conductive traces 52 provide the electrical connections necessary between electrical devices or components located throughout the feed through 50. The conductive traces 52 and ceramic feed through 50 form a connector interface on the side of the base that is outside cap 44.

The connector interface formed by the surface of ceramic feed through 50 and conductive traces 52 is used to electrically connect the optoelectronic package 10a to a second electrical subassembly, such as a PCB 14, indirectly by an intermediary device comprising, for example, a flexible circuit 12a. Typically, one of the conductive traces 52 is a ground trace that may be electrically connected directly to base 48.

The ceramic feed through 50 is structured to house multiple optoelectronic components, support thermoelectric cooler ("TEC") 54, and support conductive traces 52 through base 48. The ceramic feed through 50 is constructed from an insulating material such as a ceramic and has flat surfaces on either side of base 48 that are configured to receive the multiple optoelectronic components. In the illustrated embodiment, such optoelectronic components include, for example, an EML 56, and resistors, capacitors, and inductors that are used to balance the driving impedance of the laser with the component impedance as well as thermistors, monitor photodiodes, and the like. The optoelectronic components 56 may also include, but are not limited to, laser diodes, VCSELs, DFBs, and Fabry-Perot lasers, LEDs and the like.

TEC 54 is mounted directly to thermal slug 46. Note that the TEC 54 represents an exemplary configuration only, and various other types of cooling devices may alternatively be employed as required to suit the dictates of a particular application. Where active temperature control of one or more electronic devices is not required, the TEC 54 may be replaced with a thermally conductive spacer or similar device.

Additionally, although the depicted embodiments describe an EML, other optical signal sources, such as a semiconductor laser or light emitting diode, are also compatible with various embodiments of the invention. Also note that although reference is made herein to the use of EML 56 in conjunction with TEC 54, it should be understood that embodiments employing EML 56 are exemplary only and that additional or alternative devices may likewise be employed. Accordingly, the scope of the invention should not be construed to be limited solely to lasers and laser applications.

Additionally, various types of devices are mounted on one side of the base of the header and connected to the traces 52. In this exemplary embodiment, such devices include, inter alia, a laser disposed on top of the TEC 54, which, in turn, is mounted to the ceramic feed through 50. Thus, power and control of the device is supplied to the laser and the TEC 54 by way of connectors on ceramic feed through 50 including one or more signal signal pads, one or more low speed data pads, and one or more high current pads.

In connection with the foregoing, it should be noted further that ceramics and metals are exemplary materials only of forming window cap 44, thermal slug 46, base 48, and/or ceramic feed through 50 and any other material or combination thereof that will facilitate implementation of the functionality disclosed herein may alternatively be employed. Moreover, other embodiments of the invention may employ different arrangements and numbers of, for example, conductive and non-conductive feed throughs, or feed throughs having other desirable characteristics. Accordingly, the illustrated embodiments are exemplary only and should not be construed to limit the scope of the invention in any way.

Regarding the operational aspects of TOSA 18, in general, power is provided to EML 56, TEC 54, and/or other optoelectronic components by way of conductive traces 52 at connector interface of ceramic feed through 50. In response, EML 56 emits an optical signal. Heat generated as a result of the operation of EML 56 and/or other electronic components is continuously removed by TEC 54. The thermal slug 46 extends through base 48 and thereby ultimately removes heat out from TOSA 18. A thermistor and control circuit (not shown) can be used to measure the temperature of the laser emitter.

Turning now to FIG. 3, the optoelectronic package 10b included in ROSA 20 will now be described. The ROSA 20 generally includes a nosepiece 58 for receiving an LC ferrule. The nosepiece 58 is connected to a housing 60. The housing 60 at least partially contains an isolator 62 and an optoelectronic package 10b. It will be appreciated that housing 60 may also include a lens assembly (not shown) in order to alter the characteristics of incoming optical signals.

As shown in FIG. 3, optoelectronic package 10b includes an exemplary header structure 64 connected to a cap 66. The cap 66 can be formed substantially similar to cap 44 of optoelectronic package 10a. As discussed above, cap 66 may include a window (not shown) situated in an appropriate place to receive and/or transmit optical signals to and/or from optoelectronic component 70.

The header structure 64 includes a base 68 which is configured on one side to receive an optoelectronic component 70 disposed on a mount 72. The mount 72 is formed on base 68. Optoelectronic components 70 include, but are not limited to, photo diodes, avalanche photodiodes, LEDs, photodetectors, thermisters, and the like. The mount 72 may incorporate one or more integrated passive components, such as resistors, capacitors, and inductors, to provide improved impedance matching and signal conditioning.

The temperature of the optoelectronic component 70 can regulated by components in the header structure 64. In one embodiment, the mount 72 is a thermoelectric cooler. Details regarding how mount 72 can be configured into a thermoelectric cooler are contained in U.S. patent application Ser. No. 10/101,260 filed Mar. 18, 2002 titled "Compact Packaging assembly With Integrated Temperature Control," herein incorporated by reference.

As shown in FIG. 3, header structure 64 includes multiple leads 80 for connecting components inside optoelectronic package 10b to the exterior thereof. Bond wires are not shown in FIG. 3 to avoid obscuring aspects of the invention. However, it will be appreciated that bonding wires can be used to connect features of the optoelectronic component 70 to leads 80 by various means known in the art. Note that the length of the leads 80 on the interior side of base 68 can vary in length to facilitate bonding to bond wires. Suitable methods and materials for constructing the header structure 64 are described in U.S. patent application Ser. No. 10/101,260 filed Mar. 18, 2002, herein incorporated by reference.

As shown in FIG. 3, the header structure 64 and cap 66 are joined to form an enclosure by means such as, but not limited to, welding, brazing or soldering. In one embodiment, a hermetic enclosure is formed using metal-to-ceramic joints. In another embodiment, a non-hermetic enclosure may be formed using epoxy resins and polyimides.

Optoelectronic package 10a and optoelectronic package 10b are discussed in detail because they illustrate that each package can be connected to flexible circuits 12a, 12b using different connecting structures. As shown in FIG. 1, optoelectronic package 10a has a ceramic feed through 50 which includes conductive traces 52 formed outside the cap 44. The first end 28 of the flexible circuit 12a is connected to the conductive traces 52 of the ceramic feed through 50 and the second end 30 is connected to the PCB 14. In contrast, optoelectronic package 10b has leads 80 extending therefrom. A first end 32 of flexible circuit 12b is connected to the leads 80 and a second end 34 is connected to the PCB 14.

Optoelectronic packages 10a, 10b thus provide examples of different types of optoelectronic packages that can be used on connection with the present invention. It will be appreciated that both optoelectronic packages 10a and 10b could have a feed through structure. Alternatively, both optoelectronic packages 10a and 10b could have traditional TO packaging lead structures. In addition, it will be appreciated that optoelectronic package 10a may have lead structures while optoelectronic package 10b could have a feed through structure. Further, any optoelectronic packaging could be used with the present invention. The features of the optoelectronic packages 10a, 10b are not necessarily significant to this particular invention, but are provided for purposes of enablement. It will further be appreciated that only one of the TOSA 18 or ROSA 20 may be implemented and that more than one TOSA 18 and/or ROSA 20 may be used in an array.

III. Flexible Circuits

Figure 4:
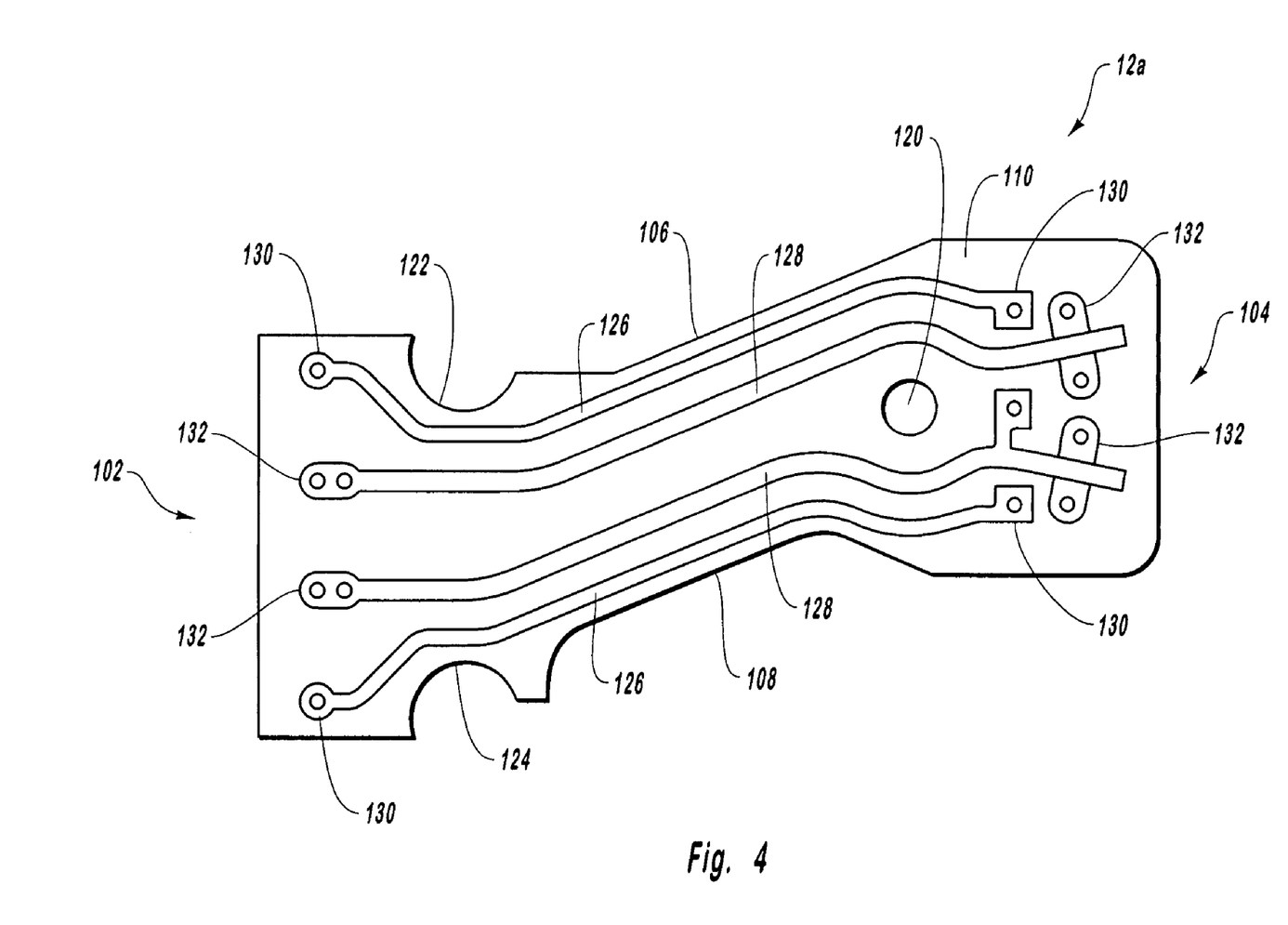
FIG. 4 shows a top view of a single-layer flexible circuit according to one embodiment of the invention.
Figure 5:
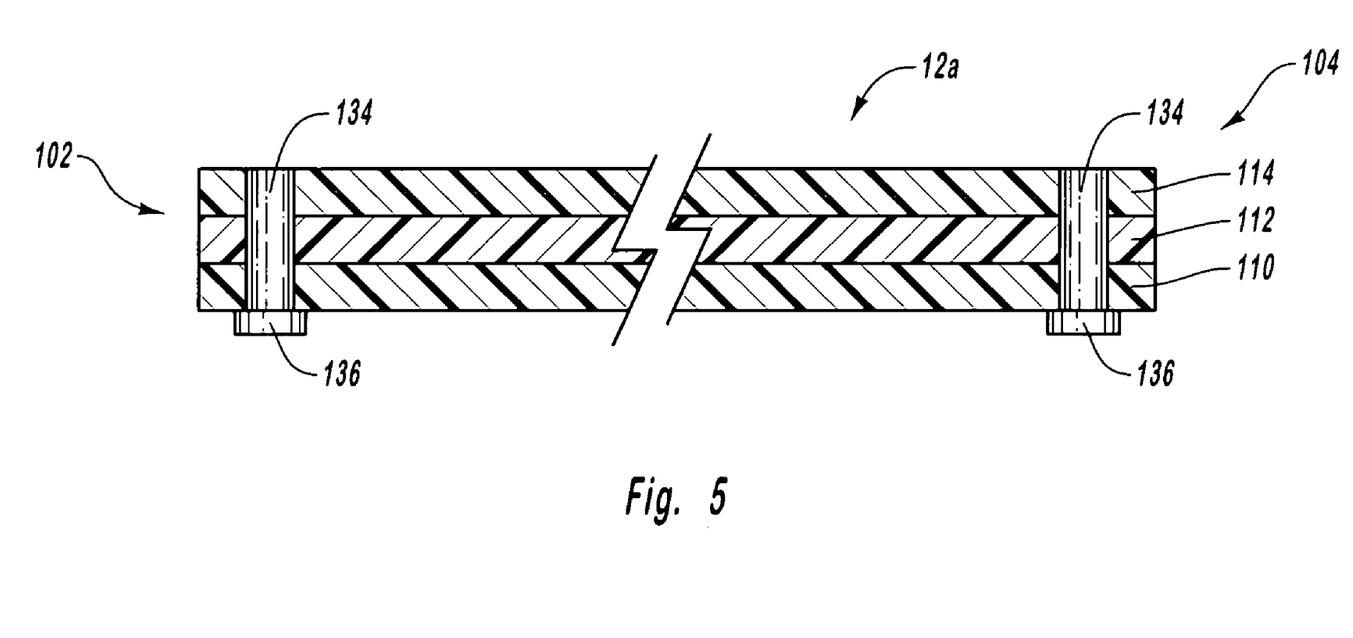
FIG. 5 shows a cross-sectional view of the single-layer flexible circuit illustrated in FIG. 4.
Figure 6:
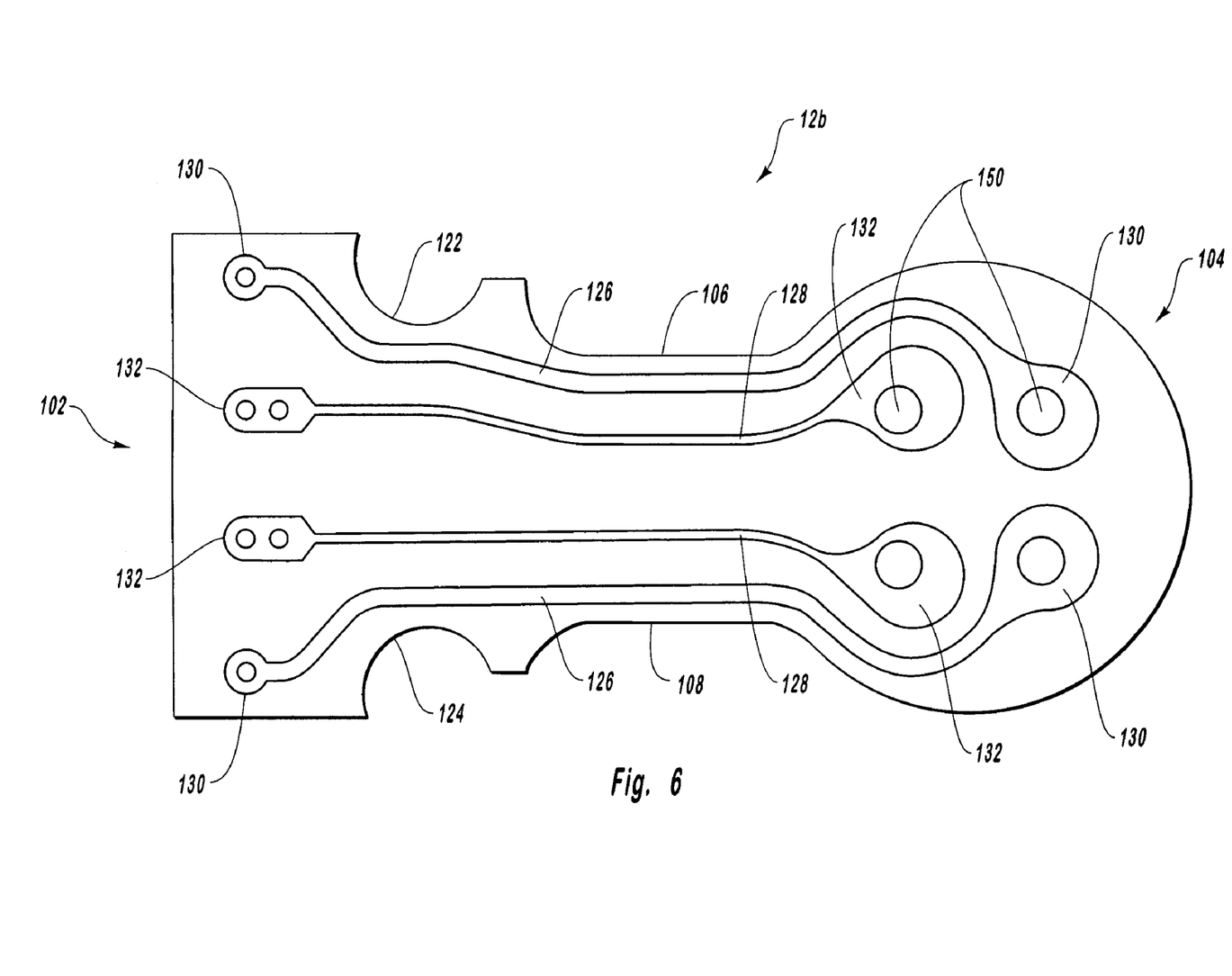
FIG. 6 shows a top view of a single-layer flexible circuit according to another embodiment of the invention.

Turning now to FIGS. 4 through 6, flexible circuits 12a, 12b will now be discussed in further detail. Generally, flexible circuits 12a, 12b are a patterned arrangement of printed wiring utilizing flexible base material. Flexible circuits 12a, 12b can comprise a waveguide design to confine and propagate electromagnetic waves along the flexible circuit.

In one embodiment, flexible circuits 12a, 12b are a single layer flexible circuit. As shown in FIG. 4, the flexible circuit 12a includes first end 102 configured to connect to PCB 14 or other suitable external component and an opposing second end 104 configured to connect to a optoelectronic package 10a. Flexible circuit 12a also includes opposing sides 106, 108. FIG. 4 shows a bottom substrate layer 110 having a conductive layer 112 formed thereon. As shown in FIG. 5, the conductive layer 112 is covered with a top cap layer 114.

In one configuration, the bottom layer 110 is a dielectric material. The bottom layer can be constructed from a laminate material, for example, polyimide, polyester, LCP, Teflon, DuPont Pyralux® AP-8525 and DuPont Kapton® E, and the like. In one embodiment, the bottom layer 110 is 0.001 inch thick.

The conductive layer 112 can include any suitable conductive material which can be formed into suitable ground and signal traces, for example, a metal such as, but not limited to copper or a copper alloy. The conductive layer 112 can be laminated onto the bottom layer 110 and then etched to form the conductive pattern that forms the appropriate traces and bonding pads. In one embodiment, signal traces and ground traces can be formed from the same material. However, the signal traces and ground traces could also be formed from different conductive materials.

The cap layer 114 is preferably a dielectric material. In one configuration, the cap layer 114 can be a laminate material, such as, but no limited to, a polyimide. The bottom layer 110 and cap layer 114 can be constructed of the same or different materials. In one embodiment, the cap layer 114 is 0.001 inch thick. In one configuration, the bottom surface of the cap layer 114 can include an adhesive to assist it in bonding to the exposed bottom layer 110 and conductive layer 112. At least a portion of the bottom substrate layer 110 and top cap layer 114 is formed from flexible materials.

FIG. 4 illustrates one embodiment of an exemplary pattern for ground traces 126 and signal traces 128. As shown in FIG. 4, ground traces 126, signal traces 128, ground pads 130 and signal pads 132 are formed in a spatial relationship so as to provide signal performance and controlled impedance throughout the transition from printed circuit board 14 to flexible circuit 12 to bonding pads 52 or leads 80.

In one embodiment, ground traces 126 are formed on the outer edge of flexible circuit 12a while signal traces 128 are formed inwardly thereof. The ground traces 126 include ground pads 130 located at both ends of the ground trace. Signal traces 128 include signal pads 132 formed at both ends of the signal trace. The signal pads 132 may include vias 134 formed therein. At least a portion of the ground traces 126 and signal traces 128 is formed in the same plane. Note that pads and vias will be collectively referred to as pads for simplicity. Nevertheless, it will be understood that each via is not necessarily a pad and each pad does not necessarily have a corresponding via.

FIG. 5 illustrates that the outside surface of the flexible circuit 12a includes means for communicating with the conductive layer 112. Using a signal trace 128 which terminates in a signal pad 132 as an example, the via 134 may extend into upper layer 114 and/or bottom layer 110. A bonding pad 136 is disposed on the bottom surface of bottom layer 110 and placed in communication with via 134. In the embodiment where flexible circuit 12a is connected to ceramic feed through 50 and a PCB 14, bonding pads 136 are placed on both ends of flexible circuit 12a. The bonding pads 136 can be formed from any suitably conductive material such as, but not limited to copper or a copper alloy. It will be appreciated that ground pads 130 can also include a corresponding bonding pad 136 formed in electrical communication with the ground pad.

It will be appreciated that the ground pads 130, signal pads 132, and bonding pads 136 are situated so as to be configured to come into electrical contact with corresponding electrical pads 52 on the ceramic feed through 50 of optoelectronic package 10a. In addition, ground pads 130, signal pads 132, and bonding pad 136 at the second end 104 of flexible circuit 12b connects to corresponding electrical pads on the PCB 14. It will be appreciated that the ground pads, signal pads, bonding pads and electrical pads may be constructed of the same or different material and that the general term "bonding pad" may be applied interchangeably to all of these components.

As shown in FIG. 4, flexible circuit 12a can include tooling holes 120 or shaped surfaces 122, 124 that enable production machinery to hold and manipulate the flexible circuit during manufacture of the flexible circuit 12a and during assembly of the transceiver module 16.

FIG. 6 depicts a flexible circuit 12b that is designed to interconnect a ROSA 20 and a PCB 14, similar to the function of flexible circuit 12a. Flexible circuit 12b is substantially similar to flexible circuit 12a and like elements will be referred to with like reference numerals. At end 104 of flexible circuit 12b, conventional openings 150 are formed in the ground pads 130 and signal pads 132 for mating with leads 80 on the ROSA 20 (see FIG. 3). In this embodiment, bonding pads 136 are not formed on end 104 of flexible circuit 12b. A soldering process completes the joining of flexible circuit 12b to the ROSA. Solder fillets are formed in the areas where the pads substantially exceed the diameter of the hole, since there are cover layer openings there. An integrated Kapton stiffening washer is bonded to the ROSA side of the flexible circuit to prevent flexing in the solder region and to thus prevent trace and solder joint breakage. In addition, as described below, an adhesive can be placed on the bottom side of bottom substrate layer 110 around holes 150 to assist in securing the flexible circuit 12b to an optical packaging 10b.

The foregoing descriptions of FIGS. 4 through 6 illustrate that flexible circuit 12 can be adapted to accommodate different connecting structures, such as bonding pads, leads, and the like. The foregoing examples of a pattern for ground traces 126 and signal traces 128 are provided merely for example and are not limiting to the present invention.

Those of skill in the art will appreciate that the signal trace 128 and ground trace 126 pattern can be configured to achieve various performance results. For examples, ground pads 130 can be placed so that they wrap around at least a portion of the signal trace 128 producing a controlled amount of capacitance coupling between the signal and the ground. This compensates for the inductance coming from the ground trace. In one embodiment of the invention the wrap around ground trace 130 is used on both the flexible circuit and on the printed circuit board.

In another example, the signal pads 132 and signal traces 128 can be configured into an optimized wave guide in a particular geometry to allow a high speed signal performance. The ground traces 126 and signal traces 128 can be formed having a width that uniquely determines the impedance of the signal trace. Generally, the wider the trace, the lower the impedance.

Generally, on PCBs, signal traces and corresponding ground traces have a preferred shape and arrangement depending on their function. For example, high speed data traces are relatively large and 50 ohm traces have a particular geometry. Because of the transition from the PCB to the flexible circuit in embodiments of the invention, however, the traces must transition in space and size because of the different structure of the flexible circuit versus the PCB. Additionally, the different characteristic impedances required of signal lines in embodiments of the invention, such as 25 or 50 ohms, places different requirements on the shape and size of each trace.

In addition, the signal pads 132 can be formed into a specific wave guide shape that has a very good signal performance for the transition from the flexible circuit 12a into the header 50, leads 80 or printed circuit board 14 in order to obtain a very high bandwidth that is extensible to, for example, 40 Gbit applications.

It will be appreciated that that ground traces 126 and signal traces 128 formed on the flexible circuit 12a and PCB 14 can include, for example, high speed data traces, low speed data traces, ground traces, and device specific power traces, such as, for example, high current thermoelectric cooler traces. Low speed data traces such as, for example, thermistor traces for temperature measurement and feedback, monitor photodiode traces for optical launch power measurement and feedback, wavelength locker traces for direct wavelength measurement and feedback, and other traces for bias current or voltage monitoring resistors or devices can also be formed as needed.

Accordingly, the present invention may incorporate specific shape optimized signal contacts, low speed data contacts, high current contacts, and ground contacts all within a single-dimensional defined space that conventionally required two dimensional configuration. Thus, both the flexible circuit 12a and PCB 14 can have a one-dimensional array of contacts to improve high-speed performance.

General advantages of flexible circuits include size and weight reduction, reduced assembly time and costs, increased system reliability, improved controlled impedance, improved heat dissipation, and three-dimensional packaging capability. Because flexible circuits can seamlessly integrate form, fit, and function, flexible circuits can contribute to reduction of assembly time.

In addition, flexible circuits allow the TOSAs and ROSAs to remain unfixed during assembly (or "float"). By being unfixed during assembly, the TOSA and ROSA can be precisely positioned for alignment of the laser transmission and/or reception of the device. In this manner, the flexible circuit can be connected to a fixed PCB and an unfixed TOSA or ROSA. The TOSA or ROSA is then aligned and finally fixed into place, if desired. Alternatively, the flexible circuit can be connected to a fixed TOSA or ROSA and an unfixed PCB. This provides a certain amount of strain relief on the PCB and/or packages. Further, it accounts for possible misalignments between the electrical portion and optical portions of the optical device.

Additionally, after assembly, the flexible circuits protect the PCB, the TOSAs, the ROSAs, and other electrical structures from the effects of vibration, jarring, or excessive movement as optical cables are moved or connected and detached from nosepiece 36. This prevents device breakage or loss of electrical contact either from a single forceful event or from the gradual effects of vibration and optical cable connecting and detachment. This isolation also provides an outlet for differential thermal contraction/expansion.

Advantageously, the single-layer flexible circuits of the present invention implement a wave-guide structure where signal pads and traces are spaced and sized to create a controlled impedance path using a single layer of etched metal. Further, because the conductive layer 112 is centrally formed between the bottom and top flexible layers 110, 114, the conductive layer resides at a neutral axis of the flexible circuit 12a. Thus, when the flexible circuit is bent, the conductive layer 112 does not experience significant tension and/or compression such as conventional double-layer flexible circuits experience. That is, the conductive layer 112 does not experience significant compression or tensile forces, which allows the flexible circuit 12a to be bent to a high degree without compromising the integrity of the conductive layer.

In contrast, conventional double-layer flexible circuits typically have a core dielectric layer with a metal layer formed on the top and bottom side. The metal layers are etched so that one forms a signal layer and the other a ground layer. After etching, a thin polyimide capping layer is formed over both layers. When bending the double-layer flexible circuit, the dual metal layers act like an I-beam structure which limits the bending radius of the flexible circuit. Since neither of the metal layers is formed on the neutral axis, one or both of the metal layers will experience tensile or compressive forces, depending on the direction of bending. Too much tensile or compression force and/or repeated bending or flexing can compromise the integrity of the metallic traces formed on the flexible circuit.

Because embodiments of the invention exemplarily employ only a single metallic layer located at the neutral axis of the flexible circuit, the flexible circuit can be formed at least 30-50% thinner than the conventional double-layer flexible circuit. This allows for reduced amount of potential strain on the central conductive layer 112. One benefit of reduced strain is that the flexible circuit can be folded more compactly than a conventional flexible circuit.

In one embodiment, the flexible circuit having a single conductive layer can be bent having an acute angle. Preferably, the entire flexible circuit is flexible, although it will be appreciated that the flexible circuit could be designed having one portion more flexible than another portion. For example, the intermediate portion could be more flexible than the end portions.

Advantageously, the flexible circuit having a single conductive layer reduces the number of etching steps. For example, in conventional double-layer flexible circuits, the two parallel metal layers requiring multiple etching steps. Because the single layer flexible circuit reduces the number of etching steps, this, in turn, reduces the cost of manufacturing by reducing manufacturing steps and the amount of manufacturing material required.

The single-layer flexible circuit also reduces or eliminates other processing steps. In conventional double-layer flexible circuits, in order to allow the parallel signal layer and ground layer to communicate, through-holes are formed between the layers and electrically plated. Single-layer flexible circuits eliminate these additional process steps by forming the signal layer and ground layer in the same metallic layer. In addition, the single-layer flexible circuits eliminate the very tight tolerance requirements for layer-to-layer registration, the minimum annual or ring dimensions for the plated through-holes, and button plating required for conventional double-layer flexible circuits.

IV. Connection to PCB

Figure 7:
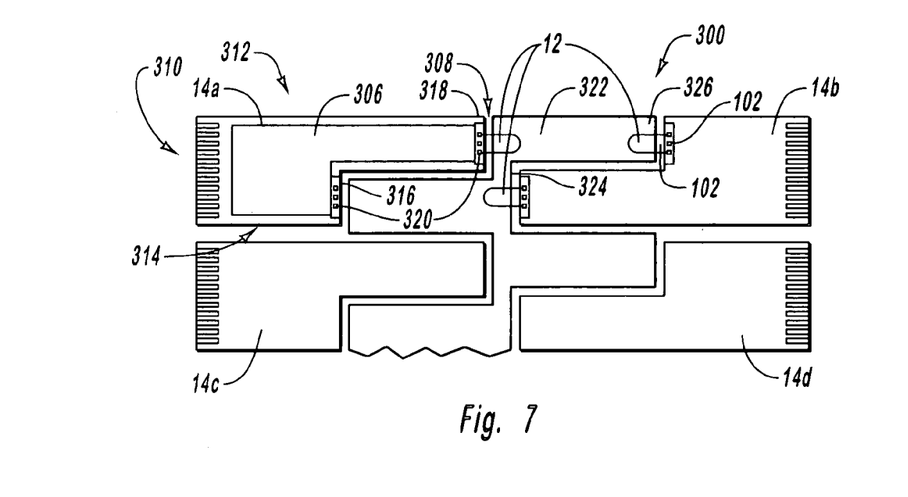
FIG. 7 shows a perspective view of an array of printed circuit boards configured to be connected to single-layer flexible circuits.

With reference to FIG. 7, an array 300 of PCBs 14a-d is shown in which the PCBs are positioned for assembly connection to the flexible circuits 12. While a 2×2 array of PCBs 14a-d is shown, it will be appreciated that the PCBs can be configured in various different configurations including more or less PCBs. It will be appreciated that as more PCBs are arrayed, automatic pick-and-place procedures can optimize the time required to connect the flexible circuits to the PCBs.

Using PCB 14a as an example (see FIG. 8), each PCB is a substantially flat component constructed of one or more layers of laminate material. PCB 14a has a top surface 302 and a bottom surface 304. An electrical circuit 306 may be formed on one or both of top surface 302 and/or bottom surface 304. The PCB 14 includes a front side 308, a rear side 310, a left side 312 and a right side 314.

Figure 8:
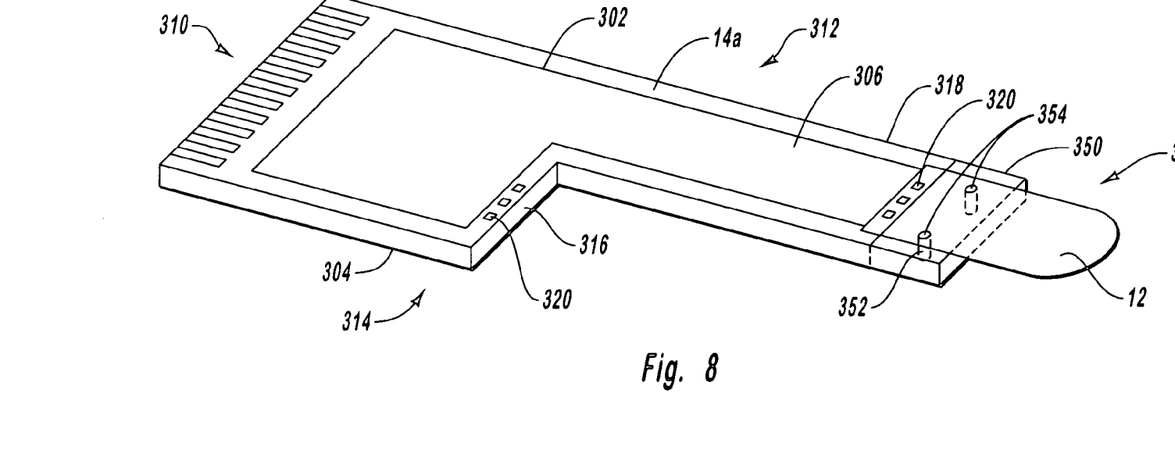
FIG. 8 shows a perspective view of an end of a printed circuit board, illustrating alteration of the printed circuit board to eliminate soldering.

The front side 308 includes a recessed portion 316 so as to form a protruding portion 318. In the embodiment of FIG. 1, the recessed portion 316 of PCB 14 is connectable to TOSA 18 while the protruding portion 318 is connectable to ROSA 20. However, recessed portions 316 can be configured to connect to a ROSA and, likewise, protruding portion 318 can be configured to connect to a TOSA. In addition, it is not essential that PCB 14 include both a recessed portion 316 and a protruding portion 318. That is, front side 308 of PCB 14 may have any polygonal or curved configuration or may be rectilinear across the entire width thereof. Solder pads 320 are formed on the edge of the recessed portion 316 and/or protruding portion 318 to connect to flexible circuits 12a, 12b.

As suggested in FIG. 7, the PCBs 14a-14d can be formed from an integral piece of laminate using a router machine. The router machine can be programmed so that the PCBs 14a-14d remain connected at discrete intervals along their outer edges. This can help to keep the PCBs 14a-d aligned during placement and connecting of the flexible circuits 12a, 12b and other components (e.g., resistors, capacitors, chips) as discussed below.

An intermediate portion 322 is shown disposed between the PCBs 14a-14d. The intermediate portion 322 can be formed from the same material as PCBs 14a-14d. In one embodiment, intermediate portion 322 can be formed from scrap material left over from cutting out PCBs 14a-14d. Intermediate portion 322 assists to connect the flexible circuits 12a, 12b to the PCBs 14a-14d as will be discussed below. The intermediate portion 322 includes recessed portions 324 and protruding portions 326 that correspond to the recessed portion 316/protruding portions 318 of PCBs 14a-14d.

In one embodiment, the flexible circuits 12a, 12b can be connected to the PCBs 14 by the following steps:

The PCBs 14a-d are cut out having recessed portions 316 and protruding portions 318. Solder pads 320 are formed on the end of the recessed portion 316 and protruding portion 318. The PCBs 14 are disposed so that the front side 308 faces inward in the arrayed assembly configuration shown in FIG. 7. The PCBs 14a-14d can be formed prior to, simultaneously, or subsequently to intermediate portion 322.

The flexible circuits 12a, 12b are connected to intermediate portion 322. This can include providing a tape and reel package of flexible circuits 12a and a separate tape and reel package of flexible circuits 12b for embodiments using the two different types of flexible circuits. Flexible circuits 12a, 12b can also be packaged on the same tape and reel in an alternating fashion. It will be appreciated that some embodiments may only use one type of flexible circuit. Regardless of the particular configuration, the flexible circuits 12a, 12b can be temporarily connected to the recessed portions 324 and/or protruding portions 326 of the intermediate portion 322 using automatic connecting mechanisms. Alternatively, manual connecting processes may also be used. Temporary connecting means includes adhesive, a weak epoxy, weak soldering, and the like. This provides that the solder pads 132b at the free-hanging end of flexible circuit 12a, 12b is available for connecting to the TOSA 18 or ROSA 20.

The intermediate portion 322 can be picked up with a vacuum unit and placed between the arrayed PCBs 14a-14d. A solder-paste can be previously stenciled onto the signal pads 132b of flexible circuits 12a, 12b so that when the ends 102 come into contact with PCB 14, the flexible circuits can be soldered thereto at the same time that all of the other components are soldered. For example, other components such as resistors, capacitors, and chips can be placed onto the PCBs 14a-14d using automatic means such as a pick and place machine. After all of the components are placed on the PCBs 14a-14d, the entire PCB array can be passed through a reflow oven.

The intermediate portion 322 can be removed prior to, or after the reflow step. The array of PCBs 14a-14d can be broken apart before, or after the soldering process.

It will be appreciated that the foregoing process eliminates the need for traditional hot bar processes. Conventional double-layer flexible circuits having plated through-holes required heat and pressure applied to each solder joint. The single-layer flexible circuits thus reduce the manufacturing steps and costs.

Figure 9:
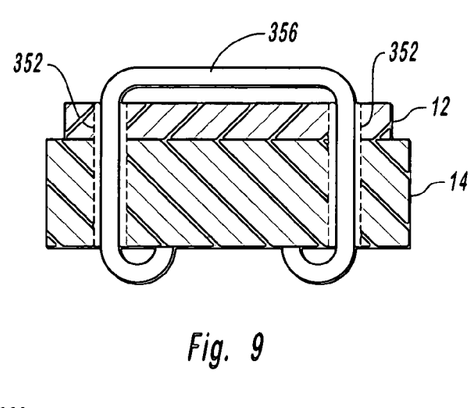
FIG. 9 shows a cross-sectional view of an end of a printed circuit board, illustrating reinforcement of the connection between the flexible circuit and the printed circuit board.

Turning now to FIGS. 8 and 9, epoxy reinforcement between the flexible circuit and PCB 14 can be eliminated. In particular, the bonding pads 320 are spaced apart from the edge of the PCB 14 to form a connection portion 350. In one embodiment, this can be done by lengthening the recessed portion 316 and/or protruding portion 318 by a small amount, for example, 0.003 or 0.004 inches. Alternatively, the bonding pads 320 can be moved farther away from the edge of PCB 14, for example, about 0.005 inches from the edge. However, the scope of the invention is not limited to any particular configuration of connection portion 350. The connection portion 350 provides space for a pair of vias 352 to be formed at the end of the PCB. Corresponding holes 354 are formed on the end 102 of the flexible circuit 12.

Before or after the end 102 of the flexible circuit 12 is soldered to the end of PCB 14, a connecting device 356 is disposed through the vias 352 and holes 354 formed in PCB 14 and flexible circuit 12, respectively. In one embodiment, the connecting device 356 can be a U-shaped round-wire staple disposed in holes 354 and vias 352 to mechanically couple the flexible circuit 12 to the PCB 14. The staple can be constructed of a high-strength material, such as steel or brass wire. The ends of the staple can be bent underneath the PCB 14 and can be swaged to increase its radius on the bottom sides. This can reduce the likelihood of forming a round profile on the end of the flexible circuit 12 to keep it flat against the PCB 14. In another embodiment, the connecting device 356 can be a rivet, screw, or other mechanical connector.

It will be appreciated that the assembly methods of the present invention allow, in one aspect, the flexible circuits 12 to be connected to a PCB 14 using automated methods, such as pick and place processes. This can drastically reduce the cost of manufacture when it comes to connecting flexible circuits to PCBs. Providing mass assembly of transceivers and other optoelectronic devices using the features of the present invention can serve to decrease the ultimate cost to the consumer.

V. Connection to TOSA/ROSA

After the flexible circuits 12a, 12b are connected to the PCB 14, the flexible circuits can subsequently be connected optoelectronic packages 10a, 10b, respectively. Turning briefly to FIG. 7, following connection of the flexible circuits 12a, 12b to PCB 14, as discussed above, the intermediate portion 322 is removed. This leaves end 104 of each flexible circuit 12 free-hanging. The end 104 of the flexible circuit 12 can be connected to a corresponding TOSA 18 or ROSA 20 as required.

For optoelectronic packages 10a having a feed through header 50, the signal pads 132a of the flexible circuit 12a is soldered to the solder pads 52 on the header.

Figure 10:
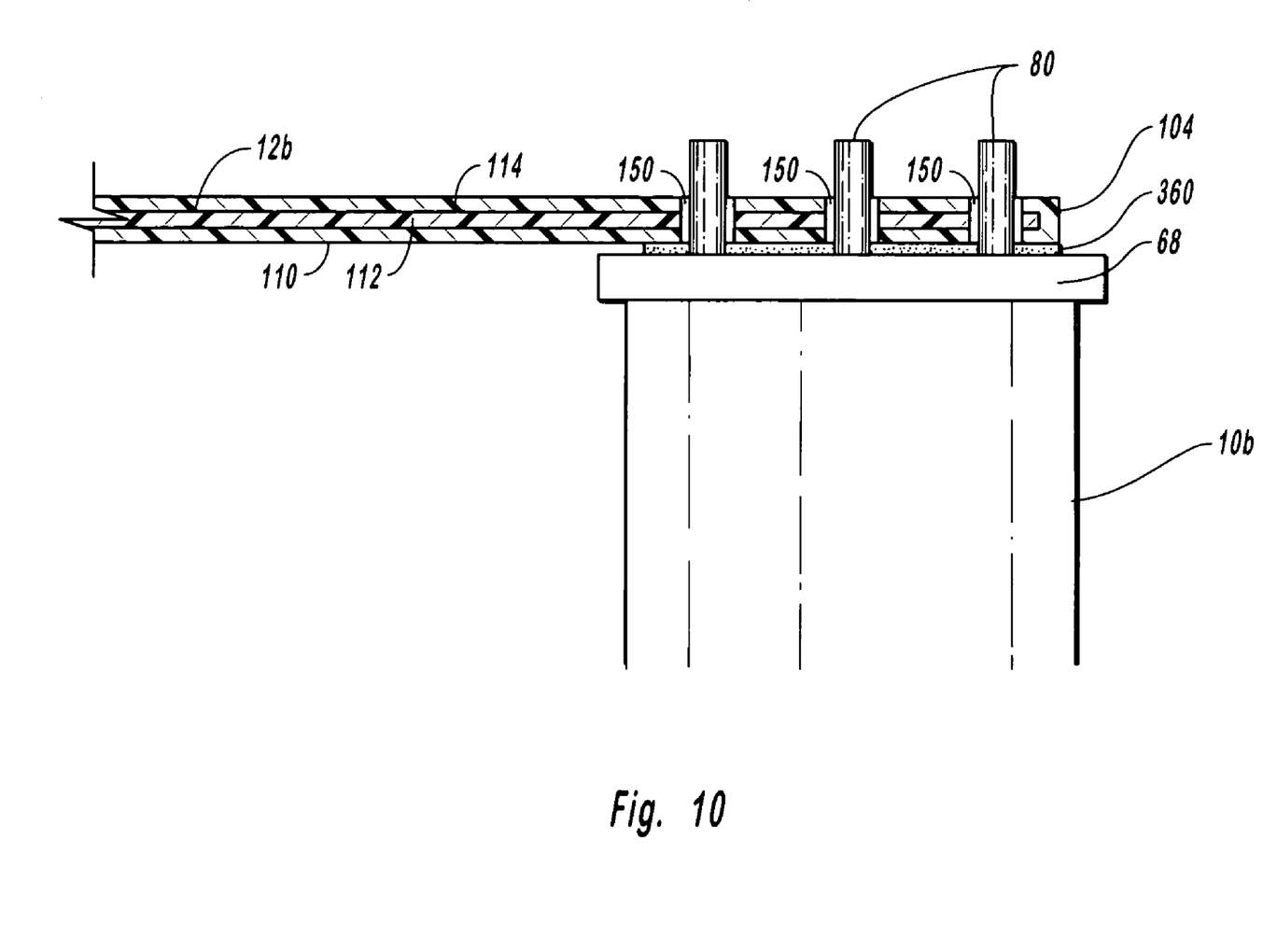
FIG. 10 shows a cross-sectional view of the connection between a flexible circuit and a TO package.

Similarly, for optoelectronic packages 10b having leads 80, the signal pads 132a of flexible circuit 12b are soldered thereto. One embodiment of connecting leads 80 to signal pads 132a is shown in FIG. 10. The holes 150 formed in the flexible circuit 12b are placed over the leads 80 and pressed flat against the base 68. It is preferred to minimize the amount of space between the flexible circuit 12b and the base 68. In one embodiment, this result can be achieved by applying a pressure sensitive adhesive 360 to the outside face of base 68 before connecting the flexible circuit 12b and before soldering. This can assist to maintain the flexible circuit 12b against the leads 80 during soldering. Alternatively, a mechanical fixture (not shown), such as spring clamps, could be used to press the flexible circuit 12b against the base 68 during soldering.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A flexible circuit comprising:
 a first flexible substrate having a first end and a second end;
 a second flexible substrate having a first end and a second end; and
 a single conductive layer comprising a ground trace and a signal trace configured and arranged such that, in use the, ground trace and the signal trace are capacitively coupled to each other, the single conductive layer further configured and arranged such that substantially all of the single conductive layer is disposed between the first flexible substrate and the second flexible substrate, at least a portion of the conductive layer having a neutral bending axis.

2. The flexible circuit as recited in claim 1, further comprising:
 at least one via defined through the second end of the conductive layer and the second end of the second flexible substrate; and
 at least one bonding pad located near the second end of the second flexible substrate and being in electrical communication with the conductive layer by way of the at least one via, wherein the at least one bonding pad is configured to be electrically connected to an external component.

3. The flexible circuit as recited in claim 1, further comprising:
 at least one via defined through the first end of the conductive layer and the first end of the second flexible substrate; and
 at least one bonding pad located near the first end of the second flexible substrate, wherein the at least one bonding pad is placed in electrical communication with the conductive layer through the at least one via, wherein the at least one bonding pad is configured to be electrically connected to an optoelectronic package housing.

4. The flexible circuit as recited in claim 1, wherein the bottom substrate and the first and second flexible substrates are composed of a dielectric material.

5. The flexible circuit as recited in claim 1, wherein the first flexible substrate comprises a laminate material.

6. The flexible circuit as recited in claim 1, wherein:
 the flexible circuit as recited in claim 1 is incorporated into a module that comprises:
 a printed circuit board; and
 an optical subassembly connected to the printed circuit board by way of the flexible circuit of claim 1.

7. The flexible circuit as recited in claim 6, wherein the optical subassembly includes a ceramic feedthrough that is electrically connected to the printed circuit board by way of the flexible circuit of claim 1.

8. The flexible circuit as recited in claim 6, wherein the optical subassembly comprises to which the flexible circuit of claim 1 is connected comprises a receive optical subassembly (ROSA).

9. The flexible circuit as recited in claim 1, wherein the signal trace includes a pad through which a via extends.

10. A flexible circuit comprising:
 a first flexible substrate having a first end and a second end;
 a second flexible substrate having a first end and a second end; and
 a single conductive layer configured and arranged such that substantially all of the single conductive layer is disposed between the first flexible substrate and the second flexible substrate, at least a portion of the conductive layer having a neutral bending axis, and at least one hole defined in the first end of each of the first flexible substrate, the conductive layer, and the second flexible substrate, wherein the at least one hole is configured to receive a first lead of an optoelectronic package housing.

11. A flexible circuit comprising:
 a top flexible substrate;
 a bottom flexible substrate;
 a signal trace disposed between the top flexible substrate and the bottom flexible substrate; and
 a ground trace disposed between the top flexible substrate and the bottom flexible substrate, wherein a portion of the signal trace and a portion of the ground trace are disposed in the same plane, and the signal trace and ground trace being configured and arranged such that, in use, the ground trace and the signal trace are capacitively coupled to each other.

12. The flexible circuit as recited in claim 11, wherein the bottom flexible substrate comprises a top surface and a bottom surface, the flexible circuit further comprising:
  at least one via located in the bottom flexible substrate; and
  at least one bonding pad located on the bottom surface of the bottom flexible substrate, wherein the at least one bonding pad is placed in electrical communication with the at least one signal trace through the at least one via.

13. The flexible circuit as recited in claim 11, wherein the signal trace and the ground trace comprise substantially the same material.

14. The flexible circuit as recited in claim 11, wherein one of the signal trace and the ground trace comprises copper.

15. The flexible circuit as recited in claim 11, wherein a portion of the signal trace is located proximate a neutral axis of the flexible circuit.

16. The flexible circuit as recited in claim 11, wherein a portion of the ground trace is located proximate a neutral axis of the flexible circuit.

* * * * *